United States Patent [19]

McQuilken

[11] Patent Number: 4,459,557

[45] Date of Patent: Jul. 10, 1984

[54] COMPRESSOR LIMITER FOR AUDIO SIGNAL PROCESSING

[76] Inventor: Mark A. McQuilken, 1229 Gaylan Dr., Cuyahoga Falls, Ohio 44221

[21] Appl. No.: 345,653

[22] Filed: Feb. 4, 1982

[51] Int. Cl.³ .................. H03G 7/08; H03G 3/18
[52] U.S. Cl. .................. 330/282; 330/279; 330/308; 330/134
[58] Field of Search .......... 330/59, 308, 86, 282, 330/138, 280, 141, 281, 134, 279

[56] References Cited

U.S. PATENT DOCUMENTS

| | | | |
|---|---|---|---|
| 3,379,991 | 4/1968 | Clerc et al. | 330/59 |
| 3,620,631 | 11/1971 | Stopka et al. | 330/281 X |
| 4,030,034 | 6/1977 | Ruegg | 330/59 |
| 4,179,669 | 12/1979 | Dodson et al. | 330/59 |

OTHER PUBLICATIONS

Rogers, A. C., et al., "AGC Amp. for Beam Profile Monitors", 1971, Particle Accelerator Conference, Accelerator Engn. & Tech., Mar. 1-3, 1971.

*Primary Examiner*—James B. Mullins
*Assistant Examiner*—Steven J. Mottola
*Attorney, Agent, or Firm*—Oldham, Oldham, Hudak, Weber & Sand Co.

[57] ABSTRACT

A compressor limiter is provided for the processing of audio signals. Fundamentally, the invention includes an amplifier receiving audio input signals and including a photoresistive element in the feedback circuit thereof. The output of the amplifier is provided to a dual stage control voltage generating circuit. The first stage generates a current through a light emitting diode corresponding to the amplitude of the output signal from the amplifier. The light emitting diode sets a threshold for suppression of the output audio signal such that, as light is emitted from the diode, it effects the photoresistor in the feedback circuit of the amplifier, thus adjusting the gain. The other branch of the control voltage generating circuitry comprises a peak detector which is operative for controlling the light emitted from the diode when successive audio signals exceeding the threshold are received in rapid succession.

4 Claims, 4 Drawing Figures

COMPRESSOR LIMITER FOR AUDIO SIGNAL PROCESSING

TECHNICAL FIELD

The invention herein resides in the art of audio signal processing apparatus and techniques. More particularly, the invention relates to a compressor limiter for attenuating amplifier gain when an input audio signal exceeds a particular threshold. The amplifier gain is adjusted as a function of the amplitude by which the input signal exceeds such threshold, and the duration for which the threshold is exceeded.

BACKGROUND ART

Voltage controlled amplifiers have been known in the art of audio signal processing for many years. Such amplifiers are used to suppress amplifier gain when the amplitude of an audio input signal exceeds a particular level. Such compressor limiters seek to attenuate high level input signals to maintain the same within a suitable range for the receiving output apparatus such as speakers or the like. This attenuation of the input signal by adjustment of amplifier gain is to reduce distortion which would otherwise occur at the output apparatus if the audio signal received thereat is of excessive amplitude. The prior art has taught that amplifier gain is suppressed anytime that the input signal exceeds a set threshold level.

In the prior art illustration of FIG. 1, there is shown a compressor limiter 10 of the feed forward type. Here, a voltage controlled amplifier 12 receives an input signal and amplifies it according to an adjustable gain to provide an output signal as shown. The adjustable or variable gain is controlled by a rectifier 14, preferably a full wave rectifier, which receives the input signal and passes it to an integrator or other RMS converter-type circuit 16. In essence, the circuit 16 functions as a filter. The output of which is passed to an amplifier 18 which has a threshold associated therewith. This threshold is set by a potentiometer, voltage divider, or the like 19. The amplifier 18 thus operates as a threshold comparator, providing an output signal corresponding to the relationship between the threshold set at 19 and the output of the filter or RMS converter 16. The output of the threshold comparator 18 is then fed to the voltage controlled amplifier 12 to appropriately adjust gain.

Another configuration of the prior art is illustrated in FIG. 2. Here, a compressor limiter 20, again of the feed forward type, is shown utilizing a voltage controlled amplifier 22 for receiving the input signal, appropriately amplifying it, and providing it to an output point. Control of the gain of the amplifier 22 is achieved in somewhat the same manner as that of FIG. 1. Here, a rectifier 23 receives the input signal and supplies it to a comparator 24 having a threshold at the positive input thereof, which is shown as being adjustable by means of a potentiometer 28. The output of the comparator 24 is then integrated or filtered as at 26 prior to application to the amplifier 22. In this situation, the gain of the amplifier 22 is adjusted according to the filtered comparison of the rectified input signal against a set threshold level.

Yet another embodiment of the prior art is depicted in FIG. 3, as the compressor limiter 30 of the feedback type. Again, a voltage controlled amplifier 32 receives an audio input signal, but the gain is now controlled by a feedback circuit comprising elements 34–39. The signal is, of course, rectified as by a full wave rectifier 34, and thence passed to an RMS converter, integrator, or filter 36. The output of the circuit 36 is then applied to a threshold comparator 38, having a threshold set as by a voltage divider or potentiometer 39. The output of the comparator 38 is fed back to the voltage controlled amplifier 32 to appropriately adjust gain.

Known prior art compressor limiters utilize some type of integrator 16, 26, 36, which of necessity incorporate an integrating or filtering capacitor. Accordingly, with the presence of such a capacitor, the prior art compressor limiters have had associated therewith inherent phase shifts between the input and the control signal. The phase shift of the control signal allows the input signal to pass through the amplifier before the voltage controlled amplifier gain can be adjusted. Further, it is known that audio signals are not sinusoidal but, indeed, vary broadly as to both amplitude and frequency. Accordingly, integration of audio signals is not given to basic integration formulas as with resistor-capacitor circuits where:

$$E_{out} = -\frac{1}{RC} \int_{t0}^{t1} E_{in} dt$$

The standard integration formula is only theoretically applicable to audio signals since such signals are constantly changing with respect to both frequency and amplitude. As a point of fact, audio signals are of broad ranges of duration. Since integrators are typically designed for particular frequencies, amplitudes, and signal durations, it is virtually impossible to provide a resistor-capacitor integrator which will operate over the requisite broad range of frequencies, amplitudes, and pulse durations. Accordingly, when utilizing a resistor-capacitor type integrator or circuit, errors are introduced to the control voltage applied to the voltage controlled amplifier, as to both phase shift and amplitude. Of course, such errors lead to distortion of the output audio signal.

In previously known compressor limiters, the capacitor in the filter or integrator has had associated therewith a specific release time, such release time being directly associated with the discharge rate of the integrating or filtering capacitor. These capacitors have typically been of a significantly large size such that release times were on the order of 100 milliseconds to 5 seconds. When the release time was shortened as by reduction of the capacitor size, the distortion of the output signal increased. Accordingly, the prior art has been shackled with a selection to be made between short release times and distortion. Further, the release time of the prior art has been initiated anytime that an input signal exceeded the threshold. At such time, the capacitor was charged and the release time was then set by the discharge rate of the capacitor. In effect, the prior art compressor limiters were unaffected by the duration of time that the input signal exceeded the threshold, but only by the fact that the threshold was exceeded.

DISCLOSURE OF INVENTION

In light of the foregoing, it is an object of an aspect of the instant invention to provide a compressor limiter utilizing an amplifier which is both voltage and duration controlled with respect to an input audio signal as compared to a threshold level.

Another object of an aspect of the invention is to provide a compressor limiter having a dynamic release time associated therewith.

Still a further object of an aspect of the invention is to provide a compressor limiter having an adjustable dynamic release time.

Still a further object of an aspect of the invention is to provide a compressor limiter which is accurately responsive to audio input signals over a broad frequency range, significantly reducing or eliminating the phase shift problems with prior art compressors and the errors in gain change accompanying attempted integration of audio signals.

An additional object of an aspect of the invention is to provide a compressor limiter which is simplistic in construction, yet reliable and accurate in operation.

The foregoing and other objects of aspects of the invention which will become apparent as the detailed description proceeds are achieved by a compressor limiter for processing audio signals, comprising: a first amplifier receiving input audio signals and amplifying the same according to an associated gain; and means connected to the output of said first amplifier for coupling a signal to a feedback circuit across said first amplifier and adjusting the gain of said first amplifier as a function of the outputs thereof.

BRIEF DESCRIPTION OF DRAWINGS

For a complete understanding of the objects, techniques, and structure of the invention, reference should be had to the following detailed description and accompanying drawings wherein.

BEST MODE FOR CARRYING OUT THE INVENTION

Figure 1:
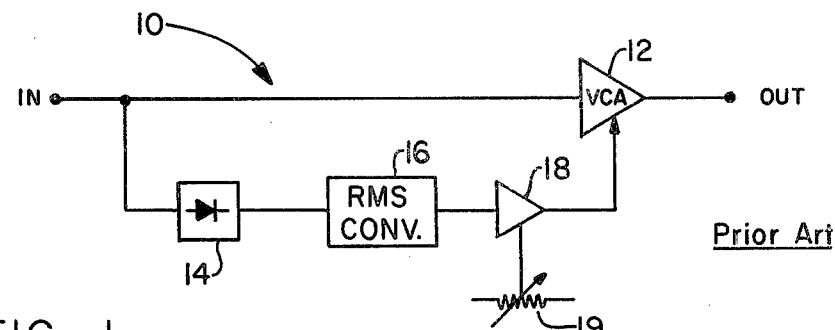
FIG. 1 is a schematic diagram of the prior art compressor limiter of the feed forward type.
Figure 2:
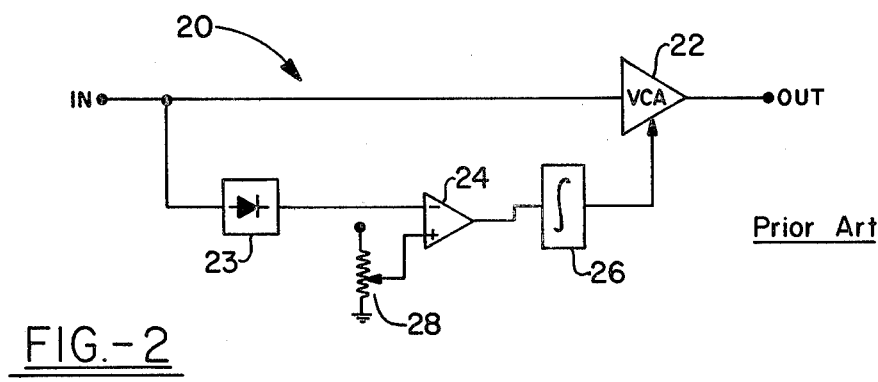
FIG. 2 is a schematic diagram of a prior art compressor limiter of the feed forward type.
Figure 3:
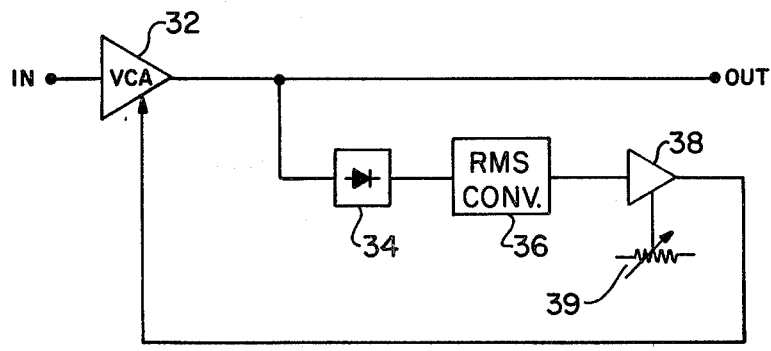
FIG. 3 is a schematic diagram of a prior art compressor limiter of the feedback type.
Figure 4:
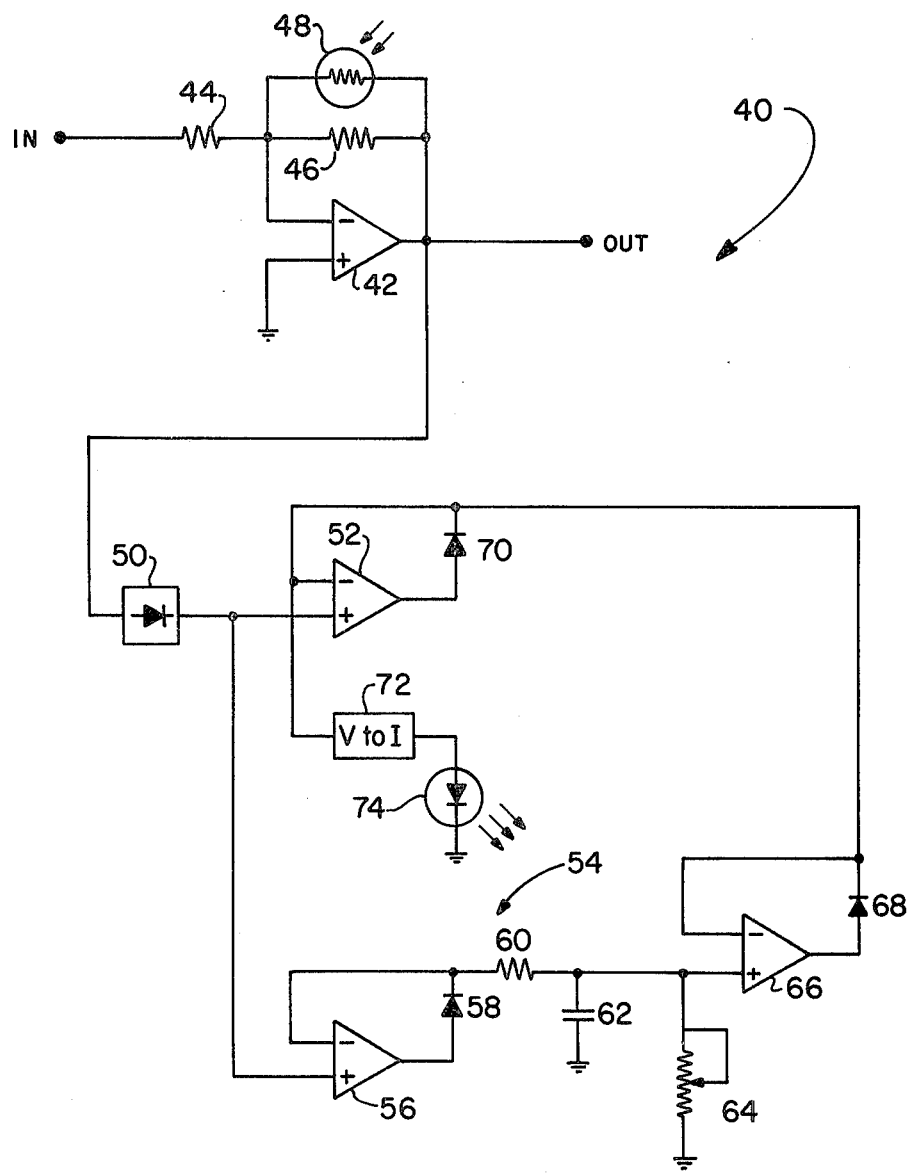
FIG. 4 is a schematic diagram of the compressor limiter of the instant invention.

With reference now to FIG. 4, it can be seen that a compressor limiter according to the instant invention is designated generally by the numeral 40. The limiter 40 includes a voltage and duration controlled amplifier 42 which, in somewhat standard fashion, receives an input audio signal and, after amplifying the signal according to an adjustable gain to be discussed hereinafter, provides an output audio signal to subsequent audio apparatus such as amplifiers, speakers, or the like. In any event, the amplifier 42 receives an audio input through an input resistor 44 and amplifies such signal as a function of the feedback impedance resulting from the parallel interconnection of the resistor 46 and the photoresistor 48. As will be discussed hereinafter, the resistance of the photoresistor 48 is a function of the photons or light impinging thereupon.

The output of the amplifier 42 is passed to a rectifier 50 which may be of any suitable nature as presently known in the art. Of course, it is preferred that the rectifier 50 be a full wave rectifier.

There are, in effect, two branches to the control voltage generation circuitry of the compressor limiter 40. The first branch comprises the amplifier 52, connected for unity gain, and receives at the non-inverting input thereof the output of the rectifier 50. The output of the amplifier 52 is passed through the blocking diode 70 to a voltage to current converter 72. The output of the converter 72 is a current, proportional in amplitude to the voltage received thereby, which current is applied to a light emitting source such as the light emitting diode 74. The light emitting diode 74 is physically maintained in close juxtaposition to the photoresistor 48 such that the light output from the diode 74 changes the resistance of the photoresistor 48, accordingly altering the gain of the amplifier 42. By allowing the voltage drop of the diode 74 to be the threshold for suppression or attenuation, it can be seen that when an audio signal exceeds such threshold, sufficient current is supplied from the voltage to current converter 72 to illuminate the light emitting diode 74. This illumination, dependent upon signal strength above threshold, alters the gain via the photoresistor 48 to bring the output signal of the amplifier 42 to threshold or below. Accordingly, the fast response time of the elements 74,48 allows for instantaneous attenuation of high level audio signals.

Also provided as part and parcel of the invention is a peak detector 54. The peak detector consists of a unity gain amplifier 56 receiving the rectified signal from the rectifier 50, and providing the same through a blocking diode 58 and through a resistor 60 to a charging capacitor 62. The capacitor 62 is preferably on the order of less than 100 ohms, while the capacitor 62 is similarly small, being on the order of 500 microfarads or less. Accordingly, while there is a time delay incident with the charging of the capacitor 62, such time delay is short.

The capacitor 62 is provided with a discharge path through the potentiometer 64, typically adjustable between 10,000 and 100,000 ohms. The adjustment allows the user to select the release time of the capacitor 62.

The voltage on the capacitor 62 is provided to the unity gain amplifier 66, the output of which is passed through the blocking diode 68 to a common line with the output of the amplifier 52. In effect, the outputs of the amplifiers 52,66 are linear ORed together, each having a blocking or isolation diode 68,70 at the output thereof. The linear OR interconnection of the amplifiers 52,66 assures that the highest level output of these amplifiers is applied to the voltage to current converter 72 to effect the light emitting diode 74, and hence the gain of the amplifier 42 via the photoresistor 48.

It will be appreciated that the peak detector 54 operates such that when a first signal in excess of the threshold is applied to the amplifier 56, the capacitor 62 charges through the resistor 60, with sufficient delay that the charge on the capacitor 62 does not affect the output of the amplifier 66 or, consequently, the voltage to current converter 72. With the resistor 60 and capacitor 62 selected as described above, it has been found that the charge on the capacitor 62 will trail the input signal approximately three db down from the input. Of course, the capacitor 62 begins immediately to discharge through the path provided by the potentiometer 64. However, if a second excessive audio signal is received in a close time frame to the first, this signal will be sufficient to charge the capacitor 62 toward the threshold level and to maintain it at that level on successively received input pulses which exceed the threshold. In such fashion, the output of the amplifier 66 may typically become the controlling voltage to the voltage to current converter 72. It will, of course, be appreciated that with the amplifiers 52,56,66 being unity gain, the input to the voltage to current converter 72 will not exceed the output threshold level of the amplifier level 42. In other words, with the amplifier 42 having its output attenuated to the threshold level by the photoresistor 48, the input to the voltage to current converter 72 will be maintained below that level and, similarly, the charge on the capacitor 62 will not exceed that level.

It should now be apparent that the peak detector 54 operates to sense rapidly successive inputs exceeding the threshold. The first such input charges the capacitor 62 through the resistor 60, with successively received excessive signals, charging the capacitor 62 to effect control of the voltage to current converter 72 via the linear OR's interconnection of amplifiers 66,52. Should only a single excessive signal be received, gain control is achieved solely by the amplifier 52 through the converter 72 and light emitting diode 74.

It will be appreciated in the structure of FIG. 4 that the output of the amplifier 42, from the rectifier 50 to the light emitting diode 74, is all encompassed in the feedback loop. Accordingly, there is no calibration required between the light emitting diode 74 and the photoresistor 48 since they are maintained in the same feedback loop.

It will further be appreciated by those skilled in the art that the compressor limiter presented herein is characterized by a substantially linear relationship between the gain of the amplifier 42 and the control voltage. In similar fashion, the amplifier 42 exhibits a substantially linear relationship between the gain of the amplifier and elapsed time for any particular control voltage. In the prior art, while there is a fixed relationship between gain and control voltage, no such relationship exists between gain and time. Further, the instant invention obtains a true time integration of the rectified audio signal because the integration is achieved through a circuit which is absent any reactive components, but which is only resistive.

Thus it can be seen that the objects of the invention have been satisfied by the structure presented hereinabove. While in accordance with the patent statutes only the best mode and preferred embodiment of the invention has been presented and described in detail, it is to be understood that the invention is not limited thereto or thereby. Accordingly, for an appreciation of the true scope and breadth of the invention, reference should be had to the appended claims.

What is claimed is:

1. A compressor limiter for processing audio signals, comprising:
   a first amplifier receiving input audio signals and amplifying the same according to an associated gain;
   a photoemissive element connected to the output of said first amplifier for coupling a signal to a photoresistive element in a feedback circuit across said first amplifier and adjusting the gain of said first amplifier as a function of the output thereof;
   a voltage to current converter interposed between said first amplifier and said photoemissive element;
   a rectifier receiving said output of said first amplifier, and a second amplifier interposed between said rectifier and said voltage to current converter; and
   a peak detector connected to and receiving an output from said rectifier and generating therefrom an output corresponding to the amplitude of peak output signals from said first amplifier, the output of said peak detector being connected through a linear OR connection with said second amplifier to an input of said voltage to current converter.

2. The compressor limiter according to claim 1 wherein said photoemissive element comprises a light emitting diode.

3. The compressor limiter according to claim 1 wherein said peak detector includes a storage capacitor having a discharge path through a variable resistor, providing for adjustment of the release time of the compressor limiter.

4. The compressor limiter according to claim 3 wherein said peak detector further includes a fixed input resistor connected to said charging capacitor.

* * * * *